US009519225B2

(12) United States Patent
Lin et al.

(10) Patent No.: US 9,519,225 B2
(45) Date of Patent: *Dec. 13, 2016

(54) SYSTEMS AND METHODS FOR HIGH-THROUGHPUT AND SMALL-FOOTPRINT SCANNING EXPOSURE FOR LITHOGRAPHY

(71) Applicant: TAIWAN SEMICONDUCTOR MANUFACTURING COMPANY, LTD., Hsin-Chu (TW)

(72) Inventors: Burn Jeng Lin, HsinChu (TW); Shy-Jay Lin, Jhudong Township (TW); Jaw-Jung Shin, Hsinchu (TW); Wen-Chuan Wang, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/962,266

(22) Filed: Dec. 8, 2015

(65) Prior Publication Data

US 2016/0091795 A1    Mar. 31, 2016

Related U.S. Application Data

(63) Continuation of application No. 14/030,490, filed on Sep. 18, 2013, now Pat. No. 9,229,332.

(51) Int. Cl.
*G03B 27/32* (2006.01)
*G03B 27/42* (2006.01)
(Continued)

(52) U.S. Cl.
CPC ....... *G03F 7/70275* (2013.01); *G03F 7/70008* (2013.01); *G03F 7/70208* (2013.01); *G03F 7/70716* (2013.01)

(58) Field of Classification Search
CPC .............. G03F 7/70208; G03F 7/70275; G03F 7/70358; G03F 7/70716; G03F 7/70725; H01L 21/682
(Continued)

(56) References Cited

U.S. PATENT DOCUMENTS

2005/0083509 A1    4/2005  Opower et al.
2005/0264777 A1    12/2005 Gardner et al.
(Continued)

OTHER PUBLICATIONS

M.A. McCord et al, "REBL: design progress toward 16 nm half-pitch maskless projection electron beam lithography," Proc. of SPIE 8323, 832311-1 (2012).

*Primary Examiner* — Colin Kreutzer
(74) *Attorney, Agent, or Firm* — Haynes and Boone, LLP

(57) ABSTRACT

The present disclosure provides a lithography system comprising a radiation source and an exposure tool including a plurality of exposure columns densely packed in a first direction. Each exposure column includes an exposure area configured to pass the radiation source. The system also includes a wafer carrier configured to secure and move one or more wafers along a second direction that is perpendicular to the first direction, so that the one or more wafers are exposed by the exposure tool to form patterns along the second direction. The one or more wafers are covered with resist layer and aligned in the second direction on the wafer carrier.

20 Claims, 9 Drawing Sheets

(51) Int. Cl.
　　*G03B 27/44*　　(2006.01)
　　*G03B 27/54*　　(2006.01)
　　*H02K 41/02*　　(2006.01)
　　*G03F 7/20*　　(2006.01)

(58) Field of Classification Search
　　USPC ............... 310/12.06; 355/46, 53, 67, 70, 77
　　See application file for complete search history.

(56) References Cited

U.S. PATENT DOCUMENTS

| | | |
|---|---|---|
| 2006/0092399 A1 | 5/2006 | Ockwell |
| 2006/0109440 A1 | 5/2006 | De Jager |
| 2006/0132734 A1 | 6/2006 | Luttikhuis et al. |
| 2006/0139602 A1 | 6/2006 | Schmidt |
| 2006/0139616 A1 | 6/2006 | Jacobs et al. |
| 2006/0158634 A1 | 7/2006 | Jacobs et al. |
| 2009/0257033 A1 | 10/2009 | Nara |
| 2012/0307222 A1* | 12/2012 | Van Zwet ............... G03F 7/704 355/67 |
| 2013/0293865 A1 | 11/2013 | Ummethala et al. |
| 2013/0342827 A1 | 12/2013 | Ummethala et al. |
| 2014/0253893 A1 | 9/2014 | Wu et al. |
| 2014/0253895 A1 | 9/2014 | Wu et al. |
| 2014/0253896 A1 | 9/2014 | Wu et al. |
| 2014/0253897 A1 | 9/2014 | Liu et al. |

\* cited by examiner

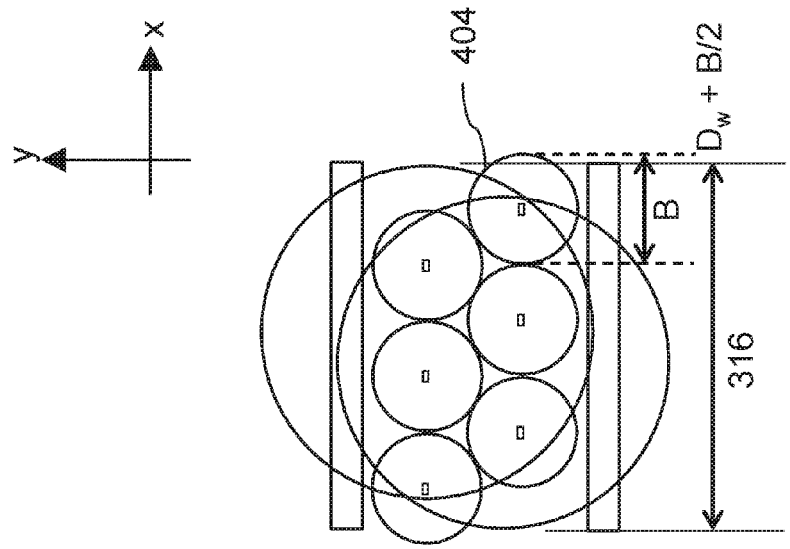
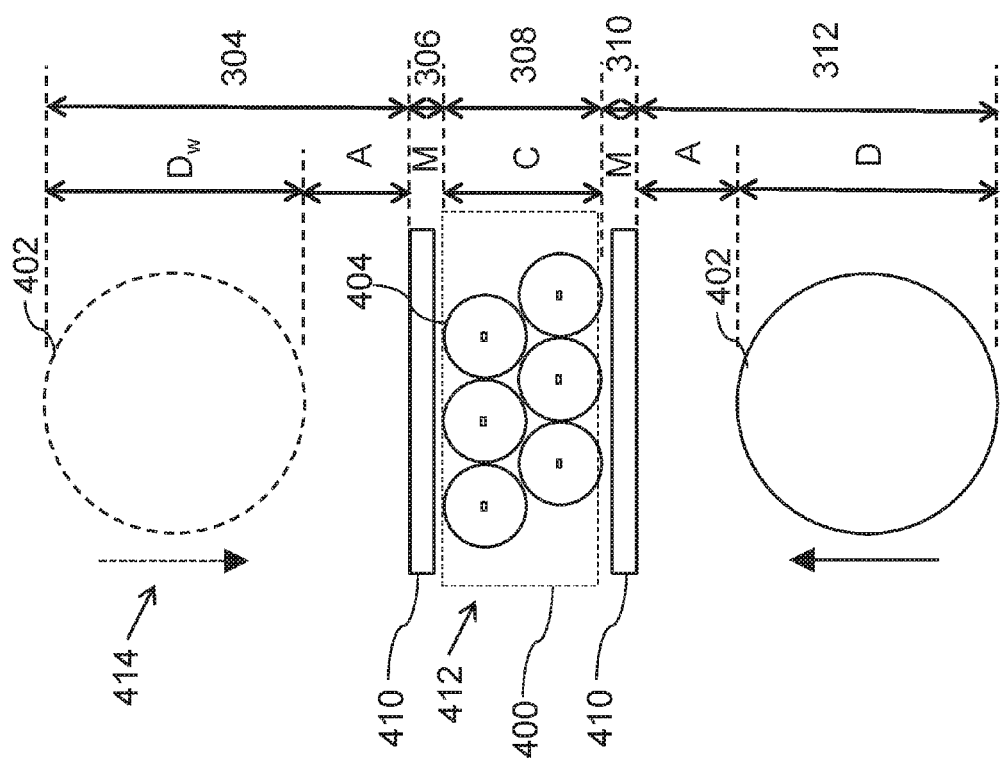

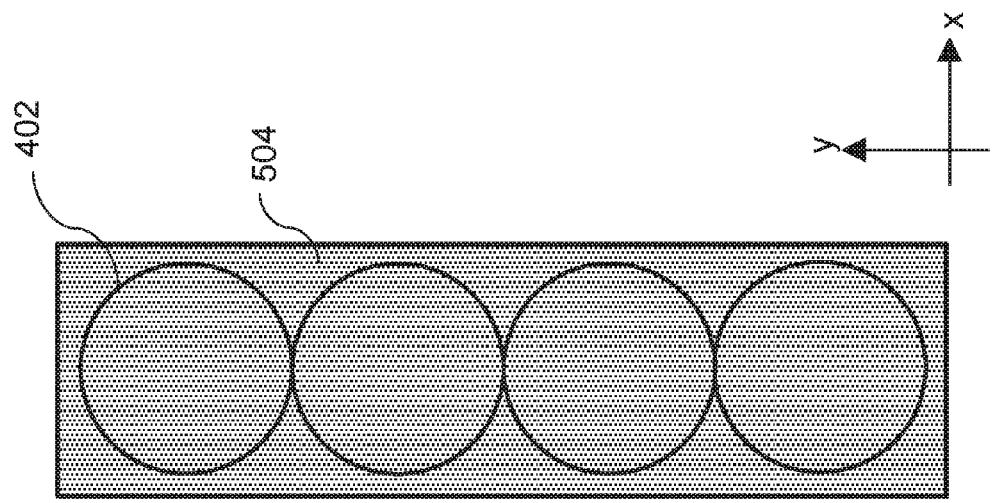
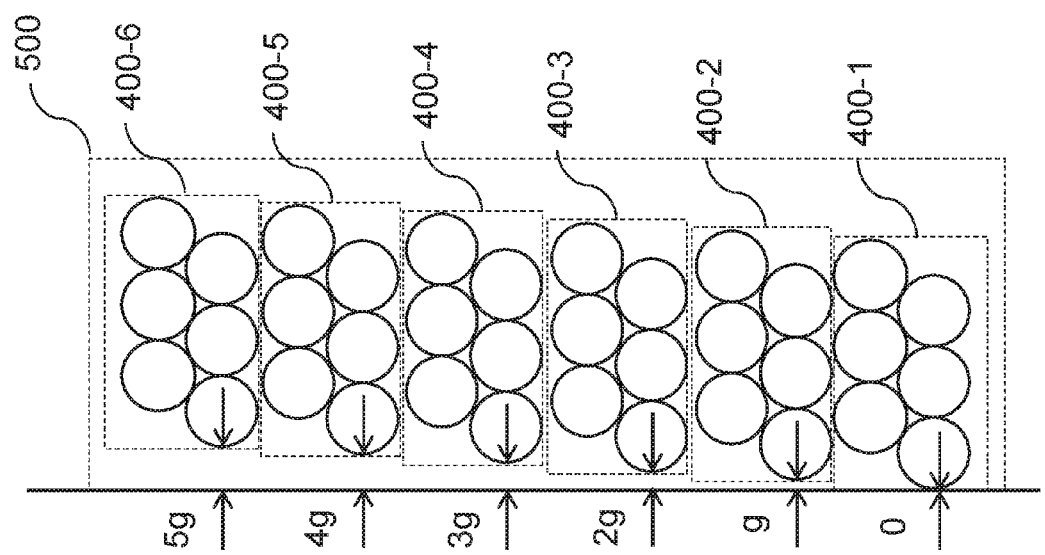

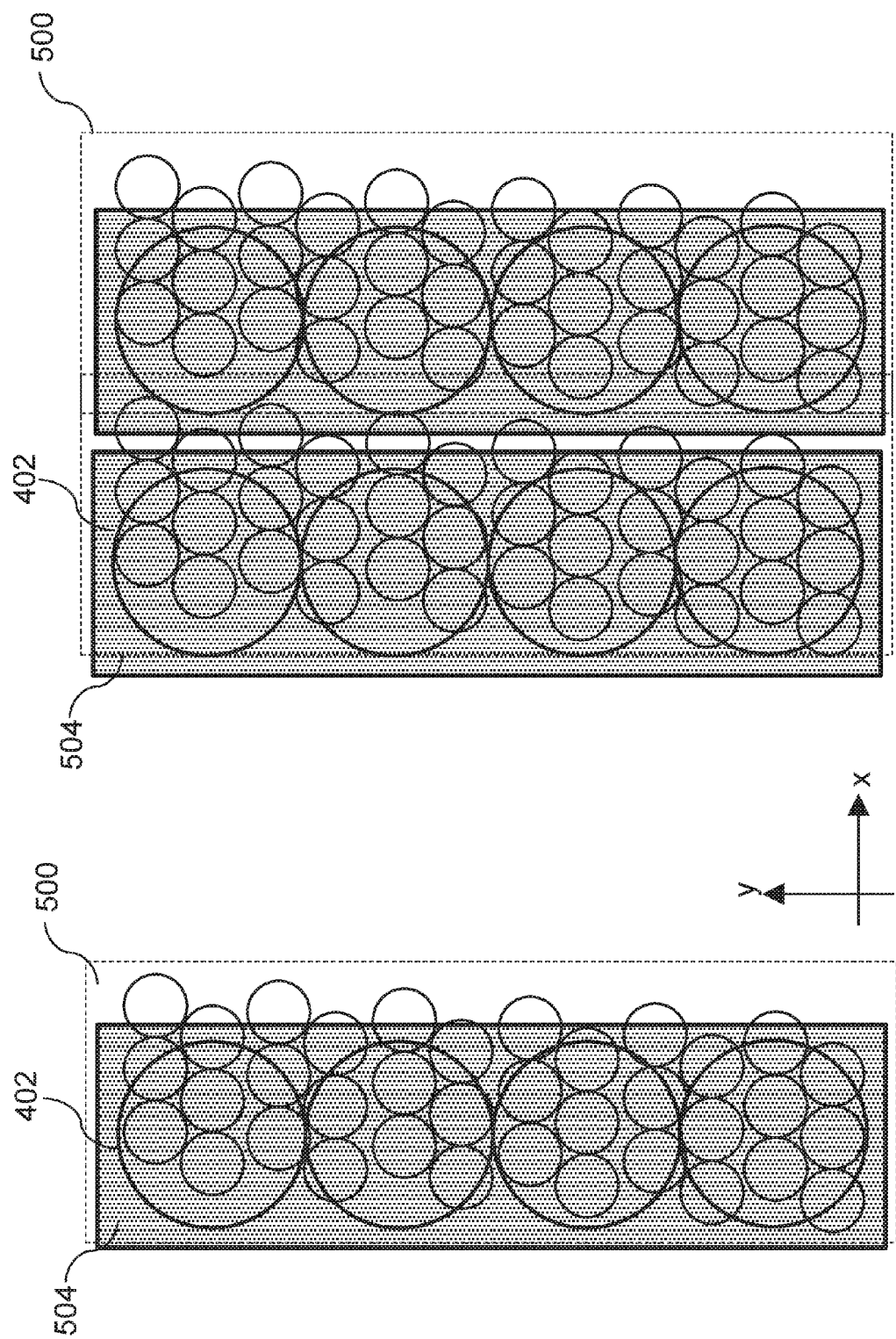

SYSTEMS AND METHODS FOR HIGH-THROUGHPUT AND SMALL-FOOTPRINT SCANNING EXPOSURE FOR LITHOGRAPHY

PRIORITY DATA

The present application is a continuation application of U.S. patent application Ser. No. 14/030,490, filed on Sep. 18, 2013, the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

Lithography generally includes the patterned exposure of a resist so that portions of the resist can be selectively removed to expose underlying areas for selective processing such as by etching, material deposition, implantation and the like. Photolithography utilizes electromagnetic energy in the form of ultraviolet light for selective exposure of the resist. As an alternative to electromagnetic energy (including X-rays), charged particle beams have been used for high resolution lithographic resist exposure. In particular, electron beams have been used since the low mass of electrons allows relatively accurate control of an electron beam at relatively low power and relatively high speed. Electron beam lithography system is also an effective method to scale down the feature size. However, wafer throughput and footprint by the current lithography systems are still not efficient enough for large scale fabrication in the IC industry.

Accordingly, what needed are systems and methods for increasing the wafer throughput and saving the footprint for the lithography system.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 4B-4C are schematic drawings illustrating the scanning and the stepping processes, respectively, during the exposure of a wafer using the UCA of FIG. 4A according to some embodiments of the present disclosure.

FIG. 5A is a top view of an exposure tool including a plurality of UCAs packed together to perform "step and scan" exposure according to some embodiments of the present disclosure.

FIG. 5B is a schematic drawing illustrating a wafer carrier securing a plurality of wafer stages to perform "step and scan" on a plurality of wafers at one time according to some embodiments of the present disclosure.

FIG. 5C is a schematic drawing illustrating the "step and scan" exposure on a plurality of wafers at one time using the exposure tool of FIG. 5A and the wafer carrier of FIG. 5B.

FIG. 5D is a schematic drawing illustrating the "step and scan" exposure on a plurality of wafers at one time using multiple exposure tools of FIG. 5A and multiple wafer carriers of FIG. 5B.

DETAILED DESCRIPTION

Figure 1A:
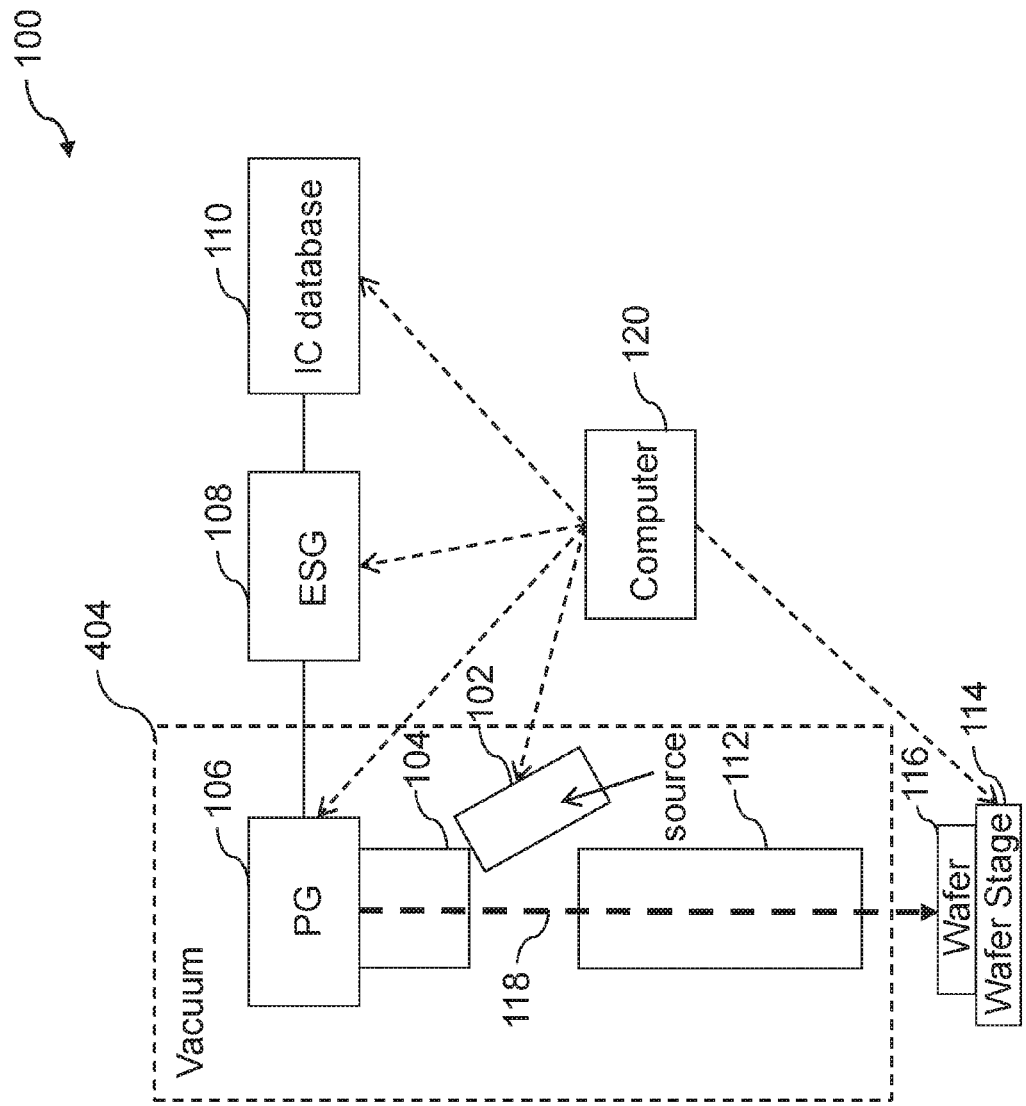
FIG. 1A represents a schematic diagram of an electron beam lithography system according to one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a schematic diagram of an electron beam lithography system 100 according to one or more embodiments of the present disclosure. In some embodiments, a lithography system may also be referred to as an exposing system or an exposure tool. As shown in FIG. 1A, the electron beam lithography system 100 includes a source 102, a condenser lens column 104, a pattern generator (PG) 106, an electric signal generator (ESG) 108, an integrated circuit (IC) design database 110, a projection lens column 112, a wafer stage 114, and a wafer 116 disposed on the wafer stage 114. It is understood that other configurations and inclusion or omission of various items in the system 100 may be possible. The system 100 is an example embodiment, and is not intended to limit the present invention beyond what is explicitly recited in the claims.

The source 102 provides a radiation beam, such as an electron beam or an ion beam. The source 102 may include an ion source or an electron source. In some embodiments, the electron source includes a cathode, an anode, and an aperture. The electron source provides a plurality of electron beams emitted from a conducting material by heating the conducting material to a very high temperature, where the electrons have sufficient energy to overcome a work function barrier and escape from the conducting material (thermionic sources), or by applying an electric field (potential) sufficiently strong that the electrons tunnel through the work function barrier (field emission sources).

The condenser lens column 104 guides the radiation beams from the source 102 to the pattern generator 106. In some embodiments, the radiation beams are parallel to each other after passing through the condenser lens column 104. In some embodiments, the condenser lens column 104 may include a plurality of electromagnetic apertures, electrostatic lenses, and electromagnetic lenses.

The pattern generator 106 is coupled through fiber optics to an electric to optical signal converter that is coupled to the electric signal generator 108 and to the IC design database 110. In some embodiments, the pattern generator 106 may include a mirror array plate, at least one electrode plate disposed over the mirror array plate, and at least one insulator sandwiched between the mirror array plate and the electrode plate or between the electrode plates. The mirror array plate includes a plurality of electric mirrors which are simply static metallic pads of the size between nanometers and micrometers. Each pad constitutes a pixel. The reflectivity of the mirrors is switched on and off by the electric signal from the electric signal generator 108. The electrode plate may include a plurality of lenslets, and the insulator layer may include an insulator. The pattern generator 106 provides patterning radiation beams 118 according to a design layout by reflecting or absorbing a radiation beam guided to each lenslet by the condenser lens column 104. The electric signal generator 108 connects to mirrors embedded into the mirror array plate of the pattern generator 106 and to the IC design database 110. The electric signal generator 108 turns mirrors on or off according to the IC design database 110 by reflecting or absorbing a radiation beam.

The IC design database 110 connects to the electric signal generator 108. The IC design database 110 includes an IC design layout. In some embodiments, an IC design layout includes one or more IC design features or patterns. The IC design layout is presented in one or more data files having the information of geometrical patterns. In some examples, the IC design layout may be expressed in a graphic database system (GDS) format. The IC design database 110 controls the electric signal generator 108 according to the IC design layout and therefore controls the pattern generator 106 to provide the patterning radiation beams 118.

The projection lens column 112 guides the patterning radiation beams 118 generated from the pattern generator 106 to the wafer 116 secured on the wafer stage 114. In some embodiments, the projection lens column 112 includes a plurality of electromagnetic apertures, electrostatic lenses, electromagnetic lenses, and deflectors. The wafer stage 114 secures the wafer 116 by electrostatic force and provides accurate movement of the wafer 116 in X, Y and Z directions during focusing, leveling, and exposing the wafer 116 in the electron beam lithography system 100. In some embodiments, the wafer stage 114 includes a plurality of motors, roller guides, and tables.

In some embodiments, a high electric potential is applied between the cathode and the anode at the source 102, which accelerates the electrons towards and through the aperture. The value of the applied electric potential determines the energy level of the electron beams leaving the aperture. The energy of the electron beams reduces as the electron beams travel toward the pattern generator 106. The pixels in the pattern generator 106 are programmed to be substantially zero or a few volts according to the signal from the optical fibers. Those pixels that are substantially zero in voltage receive the incoming electrons from the source 102. The other pixels that carry a negative voltage of a few volts will repel the incoming electrons so that they travel through the optical column 112 towards the wafer 116. The optical column 112 forms an image reduced in size and accelerates the electrons to a voltage that ranges from a few kilo volts to hundreds of kilo volts to reach the wafer 116 secured on the wafer stage 114.

The electron beam lithography system 100 is operated under a high vacuum condition. Therefore, the electron beam lithography system 100 may include one or more vacuum pumps, such as a mechanical pump for a low vacuum and an ion pump for a high vacuum.

The electron beam lithography system 100 also includes a computer 120 with a processor, a memory, and an I/O interface. The computer 120 may be coupled to the source 102, the PG 106, the ESG 108, the IC database 110, and/or the wafer stage 114, for performing one or more of the operations described herein.

Figure 1B:
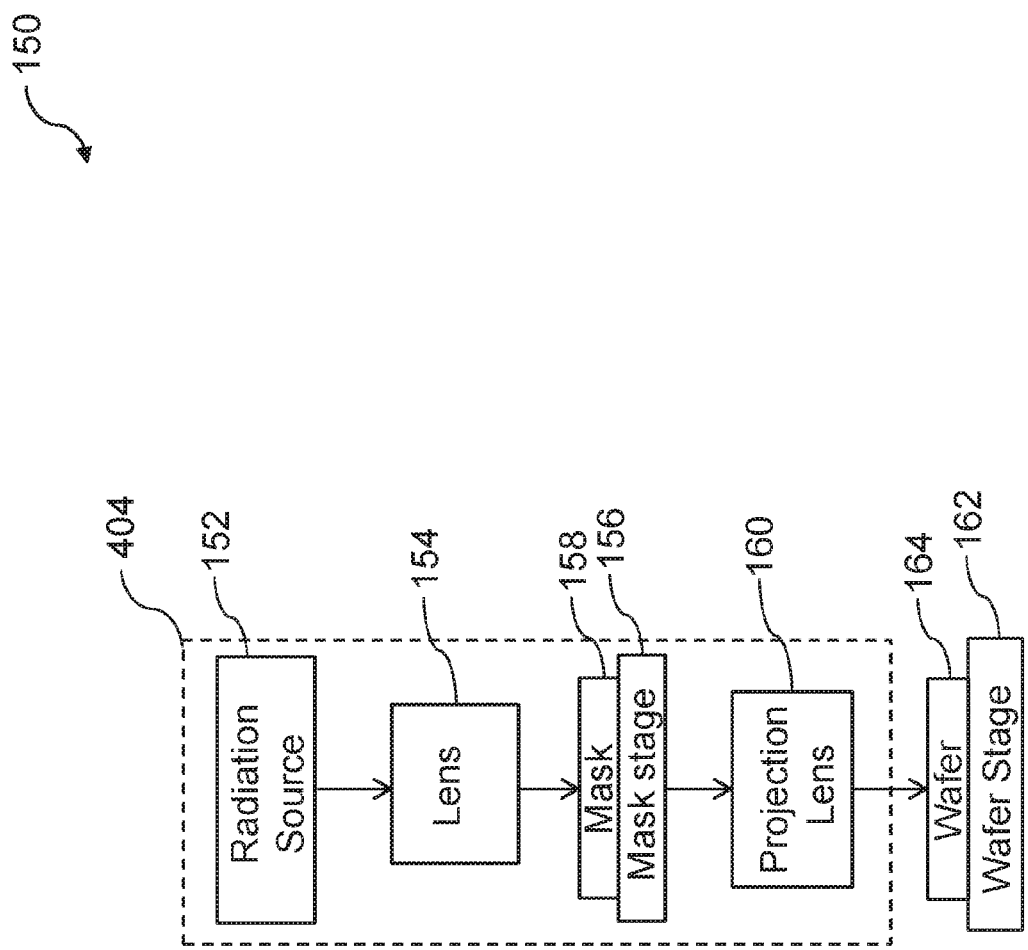
FIG. 1B represents a schematic diagram of a photolithography system according to one or more embodiments of the present disclosure.

FIG. 1B represents a schematic diagram of a photolithography system 150 according to one or more embodiments of the present disclosure. In some embodiments, the lithography system 150 can also be referred to as an exposing system or an exposure tool. The lithography system 150 is operable to expose a resist layer coated on a wafer 164 to form resist patterns. In some embodiments, the lithography system 150 includes a radiation source (illumination source) 152 to generate radiation energy (or radiation beam) to expose the resist layer. The radiation energy includes ultraviolet (UV) light, deep ultraviolet (DUV) light, extreme ultraviolet (EUV) light in various examples.

The lithography system 150 may also include an illumination module with various optical components configured to image a mask 158 onto a wafer 164. The illumination module may include multiple lenses and/or other optical components. In some embodiments as shown in FIG. 1B, the illumination module includes a lens 154 and a projection lens 160.

The lithography system 150 may also include a mask stage 156 designed to secure a mask (also referred to as reticle or photo mask) 158 and configured between the lens 154 and a projection lens 160. The mask 158 has a pattern to be transferred to the semiconductor wafer 164. The pattern of the mask 158 may include a plurality of predetermined overlay marks used in the following overlay control and monitoring process. In some embodiments, the mask 158 includes a substrate and a patterned layer formed on the substrate. In some embodiments, the mask 158 includes a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr), or other suitable material, such as MoSi. A light beam may be partially or completely blocked when directed on an absorption region. The absorption layer may be patterned to have one or more openings through which a light beam may travel without being absorbed by the absorption layer. The mask may incorporate other resolution enhancement techniques such as phase shifting mask (PSM) and/or optical proximity correction (OPC).

In some embodiments, the mask 158 is a reflective mask used in an EUV lithography system. The reflective mask includes a substrate of a low thermal expansion material (LTEM), and a reflective multilayer film formed on the substrate. The reflective mask further includes an absorption layer patterned to form a main pattern according to an IC design layout.

Referring to FIG. 1B, the lithography system 150 also includes a wafer stage 162 designed to secure a wafer 164 and is operable to move transitionally and/or rotationally. The wafer 164 may be a semiconductor wafer, such as a silicon wafer, or other suitable wafer to be patterned.

Figure 2A:
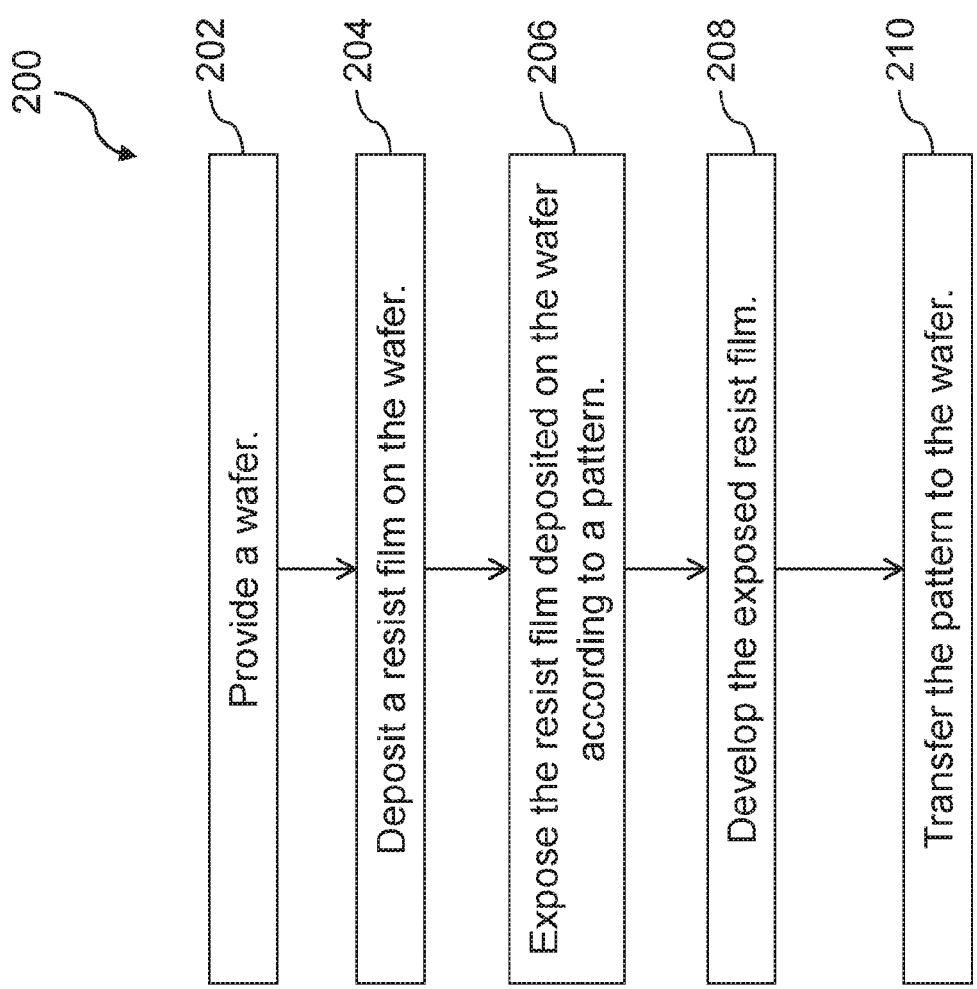
FIG. 2A is a flowchart illustrating a method of forming a pattern on a wafer according to one or more embodiments.

FIG. 2A is a flowchart illustrating a method 200 of forming a pattern on a wafer 116 and/or 164 using lithograph system 100 and/or 150 according to one or more embodiments. It is understood that additional steps can be provided before, during, and after the method 200, and some steps described can be replaced, eliminated, or moved around for additional embodiments of the method 200. FIGS. 2B-2E are cross-sectional views of a structure 220 at various lithography stages using method 200 of FIG. 2A to form a pattern on a wafer 222 according to one or more embodiments of the present disclosure.

Figure 2B:
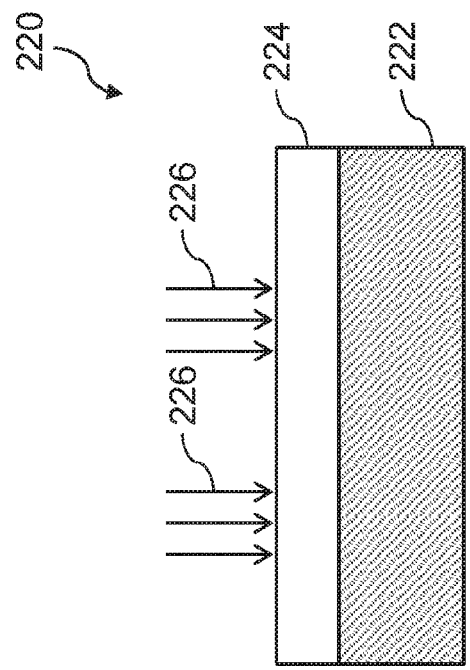
FIGS. 2B-2E are cross-sectional side views illustrating forming a pattern on a wafer using lithography method of FIG. 2A according to one or more embodiments of the present disclosure.

Referring to FIGS. 2A and 2B, method 200 begins at step 202 by providing a wafer 222. The wafer 222 can be wafer 116 of FIG. 1A, and/or wafer 164 of FIG. 1B. In some embodiments, the wafer 222 may be a silicon wafer. Alternatively or additionally, the wafer 222 may include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In some alternative embodiments, the wafer 222 includes a semiconductor on insulator (SOI). A plurality of conductive and non-conductive thin films may be deposited on the wafer. For example, the conductive material may include a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride.

Still referring to FIGS. 2A and 2B, method 200 proceeds to step 204 by forming a resist film 224 on wafer 222. In some embodiments, the resist film may include photoresist film and/or electron beam sensitive resist film. The resist film 224 may be a positive resist or a negative resist. The resist film 224 may include a single layer resist film or a multiple layer resist film. In some embodiments, the resist film 224 may be deposited on the wafer 222 using a coating process, for example a spin-on process. After the resist film 224 is deposited, a soft baking (SB) process may be performed to drive the solvent out of the resist film 224, and to increase mechanical strength of a resist film 224. In some embodiments, antireflective coating may also be formed, such as a bottom antireflective coating (BARC) or a top antireflective coating (TARC).

Figure 2C:
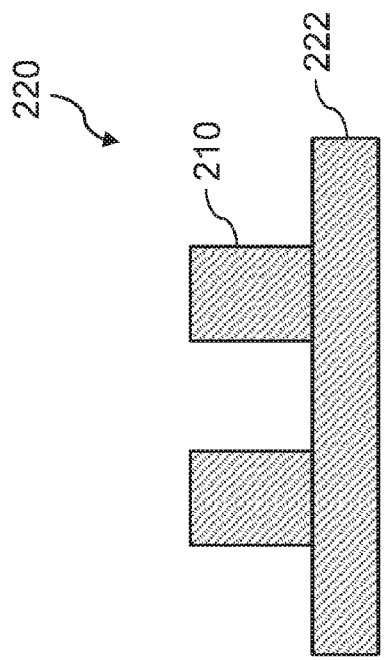

Referring to FIGS. 2A and 2C, method 200 proceeds to step 206 by exposing the resist film 224 deposited on the wafer 222 using the lithography system 100 and/or 150 to form a resist pattern. When the electron beam lithography system 100 is used at step 206, the pattern is decided by the pattern generator 106, and the light beam 226 is the patterning electron beam 118 provided by the pattern generator 106, as discussed with regard to FIG. 1A. When the photolithography system 150 is used at step 206, the pattern is decided by the pattern on the mask 158, and the light beam 226 is the radiation beam provided by radiation source 152, as discussed with regard to FIG. 1B.

Figure 2D:
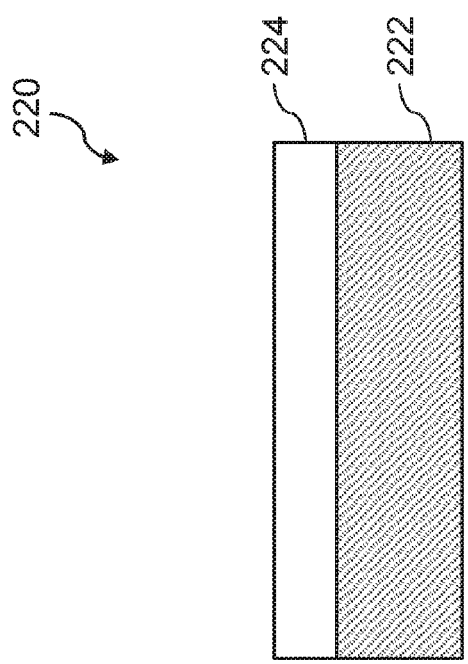

Referring to FIGS. 2A and 2D, method 200 proceeds to step 208 by developing the exposed resist film 224 on the wafer 222 to form a resist pattern 228 on the wafer 222. In some embodiments, a developer includes a water based developer, such as tetramethylammonium hydroxide (TMAH), for a positive tone development (PTD). In some embodiments, a developer may include an organic solvent or a mixture of organic solvents, such as methyl a-amyl ketone (MAK) or a mixture involving the MAK, for a negative tome development (NTD). Developer may be applied onto the exposed resist film, for example using a spin-on process. The applied developer may also be performed with a post exposure bake (PEB), a post develop bake (PDB) process, or a combination thereof.

Figure 2E:
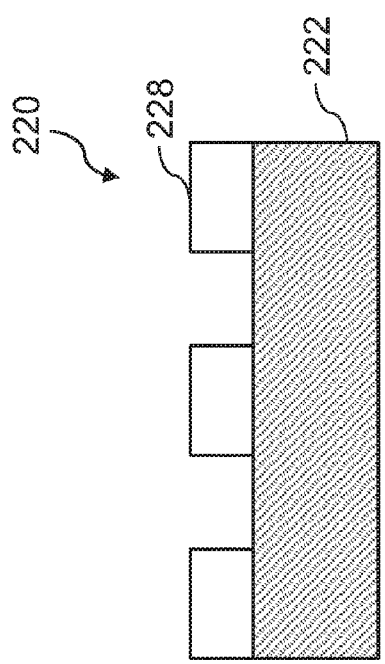

Referring to FIGS. 2A and 2E, method 200 proceeds to step 210 by transferring the resist pattern 228 to the wafer 222. As shown in FIG. 2E, a pattern 210 is formed on the wafer 222. In some embodiments, transferring the resist pattern to the wafer includes performing an etching process to the wafer 222 using the resist pattern 228 as a mask, removing the resist 228, and forming a pattern or feature (e.g., 210) on the wafer 222. The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etching process may further include using a cleaning process.

During an exposure process using the lithography system 100 and/or 150 as discussed with respect to FIGS. 1A-1B, wafer stage 114 and/or 162 may be moved so that various regions on a wafer may be exposed using one exposure tool. For example, when the wafer stage 114 and/or 162 is moving relative to the lens 112 and/or lens 154, a first region of a wafer may be exposed along an opposite direction of the moving direction of the wafer stage in a scanning mode. After finishing exposing the first region, the wafer stage 114 and/or 162 may be stepped along a direction that is perpendicular to the moving direction of the wafer stage by a predetermined distance, and the wafer stage 114 and/or 162 may then move relative to the lens 112 and/or lens 154 along a direction that is parallel to the moving direction, so that a second region which is different from the first region of the wafer may be exposed in the scanning mode. During the one or more "scanning" processes, the wafer stage 114 and/or 162 may be mobile, and the lens 112 and/or 154 may be stationary. Exposure column may include one or more lens columns 112 of lithography system 100, and/or lenses 154, masks 158 and mask stages 156 of lithography system 150 arranged in any suitable configuration. In order to increase the exposure throughput, a plurality of exposure columns may be packed together densely, as shown in FIG. 4A, to perform the "step and scan" exposure process according to method 300 as illustrated in FIG. 3.

Figure 3:
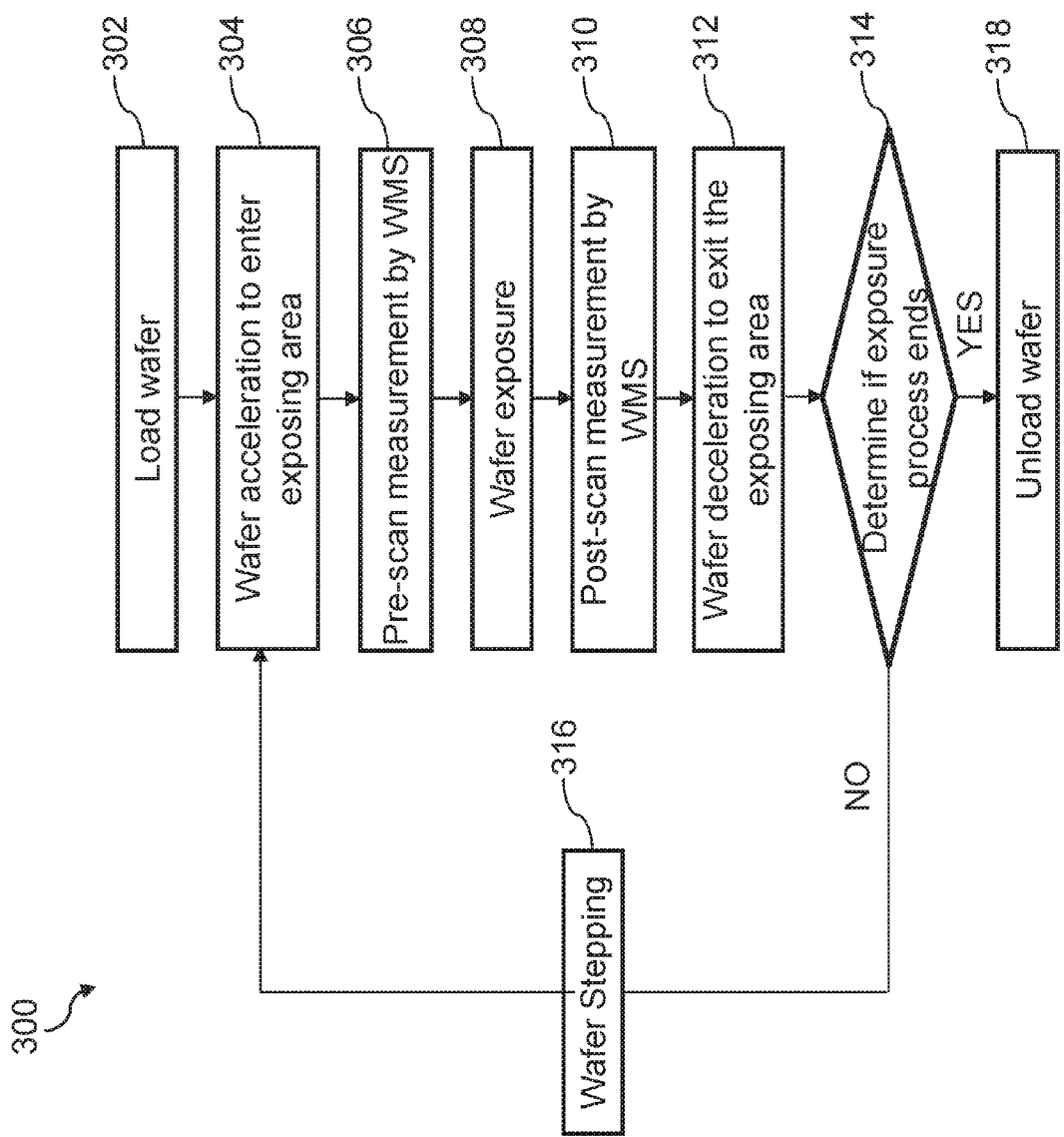
FIG. 3 is a flowchart illustrating a method of performing the "step and scan" exposure using a lithography system according to some embodiments of the present disclosure.

FIG. 3 is a flowchart illustrating a method 300 of performing the "step and scan" exposure using a lithography system according to some embodiments of the present disclosure. In some embodiments, the lithography system may be electron beam lithography system 100 and/or photolithography system 150. The method 300 may be included in step 206 of method 200 as discussed with respect to FIG. 2A. FIG. 3 will be discussed in more details with FIGS. 4A-4C in the following paragraphs.

In order to increase the exposure area on the wafer and improve the exposure throughput, a plurality of exposure columns may be densely packed together to perform the exposure of a wafer. FIG. 4A is an exemplary top view of a unit column assembly (UCA) 400 of six exposure columns 404 densely packed together to perform "step and scan" exposure of a wafer 402 according to some embodiments of the present disclosure. In some embodiments, wafer 402 may be wafer 116 of system 100 or wafer 164 of system 150. Each exposure column 404 may include lens columns 112 and 104, and pattern generator 106 of system 100. As shown in FIG. 4A, the six exposure columns 404 are densely packed in two rows each having three exposure columns arranged in line. The second row may shift to the side relative to the first row by a distance that is substantially equal to the radius of the exposure column 404, so that as UCA 400 scans across wafer 402 once, six column regions corresponding to the exposure areas 408 of the six packed exposure column 404 may be exposed at one time. In some embodiments, UCA 400 may include a plurality of exposure columns 404 arranged in any suitable topology. Each exposure column 404 includes an exposure area 408, for example in rectangular shape as shown in FIG. 4A. Exposure area 408 may include any other suitable shape. In some embodiments, the width $W_{exp}$ of exposure area 408 may be less than 0.1 mm.

Figure 4A:
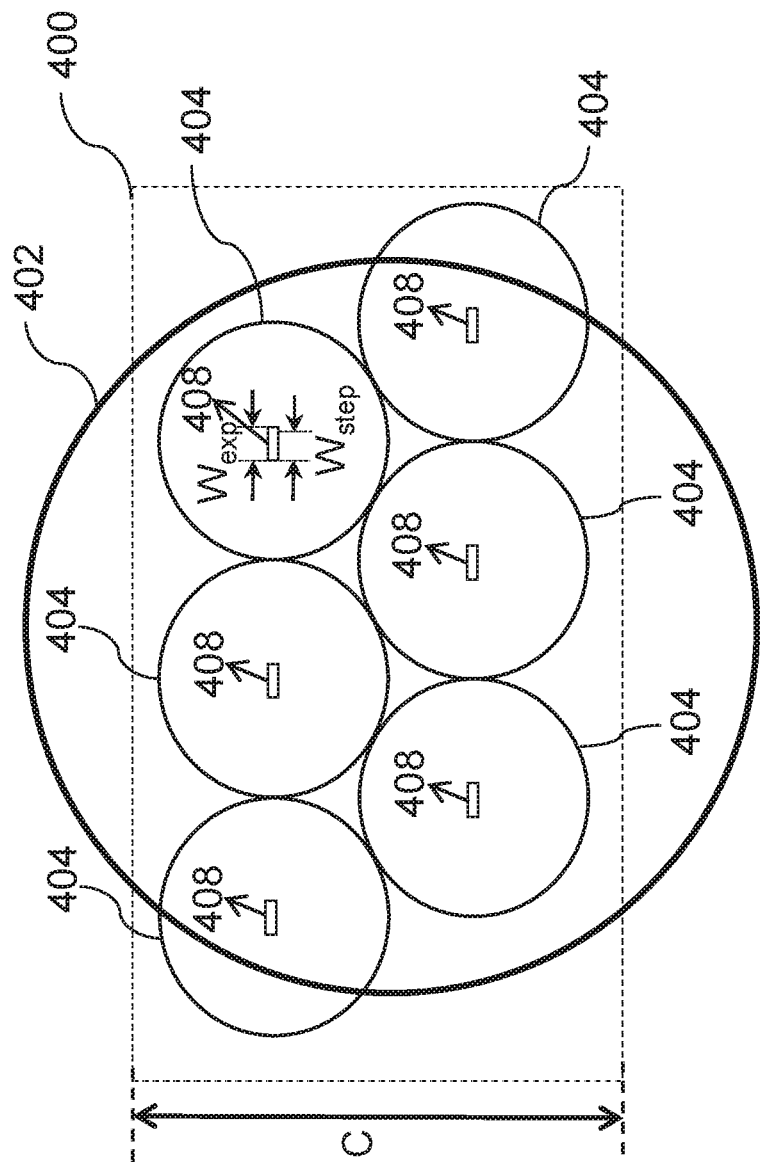
FIG. 4A is a top view of a unit column assembly (UCA) including six exposure columns densely packed together to perform "step and scan" exposure of a wafer according to some embodiments of the present disclosure.

FIGS. 4B-4C are schematic drawings illustrating the scanning and stepping processes respectively during the exposure of a wafer using UCA 400 of FIG. 4A according to some embodiments of the present disclosure. Referring to FIGS. 3 and 4B, method 300 begins with step 302 by loading a wafer 402 on the wafer stage (e.g., wafer stage 114 and/or 162). A resist film has been deposited on the surface of the wafer as discussed in step 204 of method 200. At step 302, wafer alignment may also be performed on the wafer 402 so that the resist patterns to be exposed are aligned with previous transferred patterns on the wafer 402. In some embodiments, wafer 402 may be loaded onto the wafer stage using one or more robotic arms. When a single robotic arm is used for the wafer loading process 302, a single wafer 402 may be loaded at a time. When a plurality of robotic arms are used for the wafer loading process, a plurality of wafers 402 may be loaded at a time.

When the wafer moves along the y direction, UCA 400 is mainly performing the scanning and exposing process on the wafer. The scanning process may include steps 304-312 of method 300. Referring to FIGS. 3 and 4B, at step 304 of method 300, wafer 402 is accelerated from the loading position to be moving toward, and then moving at a constant speed in the exposing area 412, where UCA 400 is used to expose the resist film deposited on wafer 402, as shown in FIG. 4B.

At step 306 of method 300, a wafer metrology system (WMS) 410 may be used to monitor and measure the position of the wafer 402 and the patterns formed on the wafer before exposure. In some embodiments, one or more sensors or devices, such as mirrors, may be mounted on a wafer carrier (and/or a wafer stage) and the WMS 410, so that the wafer's position and condition can be monitored in real time during the exposure process using any suitable technique, such as interferometry technique. In some embodiments during the pre-scan measurement, the position data of wafer 402 and UCA 400 are measured with respect to a coordinate system defined for the exposure tool, and then the position data may be used to perform an adjustment. In some embodiments, the position data may include wafer lateral and longitudinal positions. The WMS 410 may also focus the wafer to the project lens. In some embodiments, the WMS 410 may also monitor the temperature of the wafer and the wafer stage for better exposure condition control.

At step 308 of method 300, wafer 402 may be moving at a constant speed in the exposing area 412 to form a resist pattern as discussed with respect to step 206 of method 200. At step 310 of method 300, the exposed wafer 402 and/or UCA 400 may be monitored and measured again by the WMS 410 to acquire the position and condition data in a substantially similar manner as disclosed in step 306 of method 300. In some embodiments, step 310 may be optional, and step 308 may directly proceed to step 312 when step 310 is not necessary. At step 312 of method 300, the exposed wafer 402 is then decelerated to exit the exposing area 412 and settled to be ready for the stepping process. After the scanning process as discussed with respect to steps 304-312 of method 300, first six column regions of wafer 402 may be exposed to form resist patterns. The width of each exposed column region of wafer 402 is related to the width $W_{exp}$ of the exposure area 408.

Method 300 may then proceed to step 314 by determining if the exposure process of the current wafer has ended. In some embodiments, since the positions of the wafer stage and UCA 400 have been monitored, and the position data may be stored in a computer readable media using a computer (e.g., computer 120), the position data and stepping distance $W_{step}$ may be used to make the determination at step 314. In some embodiments, the number of times of stepping needed to expose a wafer may be calculated using equation 1:

$$n_{step,sw} = D_w / (W_{step} * n_c) \qquad (1)$$

wherein $n_{step,sw}$ is the number of times of stepping needed for a single wafer, $D_w$ is the diameter of the wafer, $W_{step}$ is the distance of one stepping process along the x direction as shown in FIG. 4A, and $n_c$ is the number of exposure columns in one UCA 400, for example $n_c=6$ as shown in FIGS. 4A-4C. The exposure system may keep track of how many times the wafer has been stepped, and that number may be compared with the number $n_{step,sw}$ at step 314.

At step 314, when the times of the wafer has been stepped during the current exposure process on the wafer is less than $n_{step,sw}$, method 300 proceeds to step 316 by stepping the wafer along the x direction for the next scanning process across the wafer, as shown in FIG. 4C. At step 316, the wafer may step along the x direction by a distance of $W_{step}$, as shown in FIG. 4A, so that UCA 400 may be able to "scan" one or more regions that are different from the first exposed column regions on the wafer. In some embodiments, the stepping distance $W_{step}$ is determined to be less than the width ($W_{exp}$) of exposure area 408, so that small overlaps between the adjacent two exposed regions may exist.

After the stepping process, step 316 may proceed to step 304, where the wafer may be accelerated in the y direction and opposite to the direction of the previous scanning and exposing process (e.g., direction 414 of FIG. 4B) through the previous deceleration zone at step 312. The wafer may also be measured, and exposed at a constant speed in the exposing area 412. Then the wafer may be decelerated to exit the exposing area 412 in the opposite y direction (e.g., direction 414), and settled to be ready for the determining process at step 314 again.

At step 314, when the stepping times during the current exposure process on the wafer reaches $n_{step,sw}$, method 300 proceeds to step 318 by unloading the wafer from the wafer stage for the following processes, such as steps 208 and 210 of method 200 as discussed with respect to FIG. 2A.

During the exposure process of a wafer 402, there are two parameters that may be used to evaluate the exposure system: footprint (FP) and throughput (TP). During the scanning process as shown in FIG. 4B, the footprint (FP) may be determined using equation 2:

$$FP_{scan} = 2D_w + 2A + 2M + C \quad (2)$$

where $FP_{scan}$ is the space needed to perform the scanning process across the wafer, and $D_w$ is the diameter of the wafer 402. A is the distance for the wafer 402 to accelerate to enter the exposing area 412 as shown in step 304, and to decelerate to exit from the exposing area 412 as shown in step 312 before the wafer 402 settles for determining if the exposure process ends as shown in step 314. M is the distance needed for WMS 410 to perform the measurement(s) which may include the pre-scan measurement (e.g. step 306) and/or post-scan measurement (e.g. step 310). C is the length of the UCA 400 as shown in FIGS. 4A-4B. In some embodiments as shown in FIG. 4B, C may correspond to the distance for the wafer to be moving and exposed at a constant speed in the exposing area 412.

During the stepping process as shown in FIG. 4C, the footprint (FP) may be determined using equation 3:

$$FP_{step} = D_w + B/2 \quad (3)$$

where $FP_{step}$ is the space needed to perform the stepping process on the wafer, and B is the diameter of each exposure column 404 as shown in FIG. 4C.

Throughput (TP) is defined by the number of wafers being exposed, divided by the time that is needed for the "step and scan" exposure method 300. The time needed for the "step and scan" exposure is calculated as the sum of the time for wafer loading (step 302), acceleration (step 304), pre-scan measurement (step 306), scanning for exposure (step 308), optional post-scan measurement (step 310), deceleration (step 312), and wafer stepping (step 316) . . . and wafer unloading (step 318). In some embodiments, post-scan measurement at optional step 310 may not be necessary. As shown in FIGS. 4B-4C, the sum of the time $t_{sw}$ needed for the "step and scan" exposure process on a single wafer may be determined using equation 4-1:

$$t_{sw} = t_L + n_{step,sw} * (t_{scan,sw} + t_M + t_A + t_{step}) \quad (4\text{-}1)$$

wherein $t_L$ indicates the time that is needed for wafer loading, alignment, and unloading processes. In some embodiments, $t_L$ may also include the time needed for wafer surface measure. $t_{scan,sw}$ is the time needed for wafer scanning through the UCA 400 as discussed with respect to step 308 of method 300. $t_{scan,sw}$ can be further expressed in equation 4-2 as follow:

$$t_{scan,sw} = (C + D_w)/v \quad (4\text{-}2)$$

where v is the average scanning speed at step 308. $t_M$ is the time needed for pre-scan and post-scan measurements using WMS 410 at steps 306 and 310, $t_A$ is time for acceleration and deceleration at steps 304 and 312, $t_{step}$ is the time needed for the wafer to step along the x direction between scans in the y direction, as discussed with respect to step 316. When a single-wafer-stage tool is used for the "step and scan" exposure as discussed above on n wafers, the time required is $n*t_{sw}$, because one wafer can be loaded on the wafer stage to perform the "step and scan" exposure at one time. Therefore, the throughput (TP) of the "step and scan" exposure process on a single wafer may be determined using the following equation 5:

$$TP_{sw} = 1/t_{sw} = 1/[t_L + n_{step,sw} * (t_{scan,sw} + t_M + t_A + t_{step})] \quad (5)$$

FIG. 5A is a top view of an exposure tool 500 including multiple UCAs 400 packed together to perform "step and scan" exposure according to some embodiments of the present disclosure. The exposure tool 500 may be integrated into the lithography system 100 and/or 150. In the exemplary embodiment shown in FIG. 5A, six UCAs 400-1 to 400-6 are packed together to form the exposure tool 500. Each UCA 400 includes six exposure columns 404 densely packed in the same topology as discussed with respect to FIG. 4A. As shown in FIG. 5A, UCAs 400-1 to 400-6 are arranged in a column so that each UCA shifts relative to the UCA in the next row by a distance g. For example, UCA 400-2 shifts relative to UCA-1 by a distance of g, and UCA 400-3 shifts relative to UCA-1 by a distance of 2g, . . . , and UCA-6 shifts relative to UCA-1 by a distance of 5g, as illustrated in FIG. 5A. Since the packed multiple UCAs perform the "step and scan" exposure at the same time, the number of times of stepping needed to expose a wafer may be calculated using equation 6:

$$n_{step,nw} = D_w/(W_{step} * n_c * n_u) \quad (6)$$

where $n_u$ is the number of UCAs packed together in exposure tool 500.

FIG. 5B is a schematic drawing illustrating a wafer carrier 504 securing a plurality of wafers 402 to perform "step and scan" exposure on a plurality of wafers at one time according to some embodiments of the present disclosure. As shown in FIG. 5B, the wafers 402 are placed next to each on the wafer carrier 504. During the "step and scan" exposure process, the plurality of wafers 402 secured on the wafer carrier 504 move together. In some embodiments, the plurality of wafers 402 are placed on the wafer carrier 504 along the scanning direction (e.g., the y direction), so that the exposure tool 500 may scan the plurality of wafers 402 on the wafer carrier 504 at one time. Then the plurality of wafers 402 may step together along a stepping direction (e.g., the x direction) that is perpendicular to the scanning direction after one scan to start the next scan along the scanning direction. In some embodiments, the wafer carrier 504 may secure a plurality of wafer stages, and each wafer stage holds a wafer on the wafer stage.

FIG. 5C is a schematic drawing illustrating the "step and scan" exposure process performed on a plurality of wafers (i.e. $n_w$ wafers) secured on the wafer carrier 504 using the exposure tool 500 of FIG. 5A and the wafer carrier 504 of FIG. 5B. The "step and scan" exposure may be carried out using method 300 as discussed with regard to FIG. 3. The wafer carrier 504 may move along y direction so that the exposure tool 500 may perform the scanning process. Because multiple wafers are moving together on the wafer carrier 504, the time $t_M$ for pre-scan and post-scan measurements using WMS 410 at steps 306 and 310, and the time $t_A$ needed for acceleration at steps 304 and 312 do not increase compared to the time $t_M$ and $t_A$ used for a single wafer. The system shown in FIG. 5C is referred to as an acceleration and metrology sharing (AMS) system for the purpose of simplicity. Therefore, the sum of the time $t_{nw}$ needed for the "step and scan" exposure process performed on $n_w$ wafers on the wafer carrier 504 may be determined using equation 7-1:

$$t_{nw} = n_w * t_L + n_{step,nw} * (t_{scan,nw} + t_M + t_A + t_{step}) \quad (7\text{-}1)$$

In equation 7, the times $t_L$ needed for wafer loading, alignment, and unloading, and the time $t_M$ needed for pre-scan and post-scan measurements are assumed to be the same for each wafer on the wafer carrier 504. The scanning time $t_{scan,nw}$ reflects the scanning time of $n_w$ wafer using $n_u$ UCAs packed together in the exposure tool 500, as shown in FIGS. 5A and 5C. $t_{scan,nw}$ can be further expressed using equation 7-2 as follow:

$$t_{scan,nw} = (n_u * C + n_w * D_w)/v \quad (7\text{-}2)$$

where v is the average scanning speed at step 308.

In some embodiments, a plurality of wafer stages may be used to hold the wafers on the wafer carriers. The wafers may be adjusted in the respective wafer stage, so that an accurate alignment of the exposure patterns may be provided between each wafer and the exposure area. Alternately, the wafer stage may each secure a wafer, and multiple wafer stages may be scanned at substantially similar speeds together without a wafer carrier 504.

Referring to FIG. 5C, when multiple robotic arms, for example $n_w$ robotic arms, are used for wafer loading and unloading, the sum of time $t_{nw}$ needed for the "step and scan" exposure process performed on $n_w$ wafers may be further shortened to:

$$t_{nw}=t_L+n_{step,nw}*(t_{scan,nw}+t_M+t_A+t_{step}) \quad (8)$$

Equation 9 shows the time saved $t_{saved}$ by using AMS exposure tool 500 including $n_u$ UCAs to expose $n_w$ wafers (FIG. 5C), compared to using one UCA to expose $n_w$ wafers respectively (FIG. 4A):

$$t_{saved} = n_w * t_{sw} - t_{nw} \quad (9)$$
$$= (n_w - 1)*t_L + n_{step,nw}*(n_w*n_u - 1)*(t_M + t_A + t_{step}) +$$
$$n_{step,nw}*n_u*(n_w - 1)*(C/v) + n_{step,nw}*n_w*(n_u - 1)*(D_w/v)$$

The difference of the throughput (TP), or the gain of the exposed wafers per hour, of using one UCA to expose one wafer (FIG. 4) compared to the TP of using AMS (FIG. 5C) may be determined using the following equation 10:

$$TP_{gain}=n_w/t_{nw}-1/t_{sw}=t_{saved}/(t_{nw}*t_{sw}) \quad (10)$$

The normalized throughput gain ($TP_{gain}$) from equation 10 is shown in equation 11:

$$TP_{norm,gain}=(n_w/t_{nw}-1/t_{sw})/(1/t_{sw})=t_{saved}/t_{nw} \quad (11)$$

The gain of the footprints ($FP_{gain}$) of using one UCA to expose $n_w$ wafers respectively (FIG. 4) compared to the TP of AMS (FIG. 5C) may be determined using the following equation 12:

$$FP_{gain} = n_w * FP_{sw} - FP_{nw} \quad (12)$$
$$= n_w*(2D_w + 2A + 2M + C)*(D_w + B/2) -$$
$$(2n_w*D_w + 2A + 2M + n_u*C)*(D_w + B/2)$$
$$= [(2A + 2M)*(n_w - 1) + (n_w - n_u)*C]*(D_w + B/2)$$

The normalized footprints ($FP_{norm,gain}$) from equation 12 is shown in equation 13:

$$FP_{norm,gain}=(n_w*FP_{sw}-FP_{nw})/(n_w*FP_{sw})=[(2A+2M)* \\ (n_w-1)+(n_w-n_u)*C]/[n_w*(2D_w+2A+2M+C)] \quad (13)$$

For different lithography system, the number ($n_w$) of wafers per carrier, and the number of the exposure columns ($n_u$) per exposure tool can be optimized to maximize the throughput gain and/or minimize the footprint gain using the above disclosed equations such as equations 9-13.

As shown in FIG. 5A, two adjacent UCAs may be shifted by a distance g so that the exposure areas on exposure columns of all the UCAs do not expose overlapping regions during one scanning process. In some examples, the shifting distance (g) between two adjacent UCAs may be chosen to be a length that is slightly less than the width ($W_{exp}$) of the exposure area 408 of each exposure column. The shifting distance (g) may also be less than the radius of the exposure column (B/2).

Table 1 shows a set of parameters of an electron beam lithography system (e.g., lithography system 100) with six UCAs packed together for exposing seven wafers secured on the wafer carrier.

TABLE 1

Parameters of a multiple-e-beam scanning system.

| Wafer Dia, $D_w$ (mm) | $W_{expo}$ (mm) | Accel, settling, A (mm) | WMS, M (mm) | Length of UCA, C (mm) | Dia of col, B (mm) | $n_{wafer}$ | $n_u$ | $n_c$ | scan speed (mm/sec) | $t_L$ (sec) | $t_a$ (sec) | $t_{sh}$ (sec) |
|---|---|---|---|---|---|---|---|---|---|---|---|---|
| 300 | 0.08 | 130 | 50 | 190 | 10 | 7 | 6 | 6 | 2000 | 13.8 | 0.10 | 0.056 |

As shown in Table 1, the width of the exposure area 408 ($W_{exp}$) is chosen to be 80 μm. Acceleration is chosen to be 3G and the settling time is 30 msec, resulting in a distance of 130 mm for acceleration and settling to reach 2000 mm/sec. The acceleration and settling time $t_A$ is 0.1 sec. The stepping along x direction between scans along y direction may also experience acceleration, deceleration, and settling processes. The stepping time ($t_{step}$) is taken to be 56 msec. The pre-scan and post-scan measurements by WMS may be selected to be performed in a distance of 50 mm (M). With exposure columns having diameter (B) of 10 mm, six densely packed UCAs have a length (C) of 190 mm. As an illustration, seven wafers secured on the wafer carrier 504 are performed the "step and scan" exposure at one time. The time required for wafer loading, unloading, and alignment is 13.8 sec ($t_L$).

The performance of the exposure tool using n single-wafer systems (of FIG. 4A) to expose n wafers using one UCA exposure tool, versus AMS is compared in Table 2. The number of steps along x direction ($n_{step,nw}$) when using AMS is reduced by slightly more than 6 times compared to the number of steps when using the single wafer system ($n_{step,sw}$). In the current example, compared to the single-wafer system, 29% less footprint with 7% more wafer throughput can be obtained by using the AMS system. The AMS system may support 36 columns in the smaller footprint against the 42 columns in the single-wafer system. Even with more columns in the single-wafer system, the wafer throughput per column is calculated to be 3.23:4.02, and the wafer throughput per footprint is 25.91:39.08. Therefore the AMS system demonstrates a throughput gain per column of 25%, and a throughput gain per footprint of 51% respectively compared to the single-wafer system.

TABLE 2

Parameters of a multiple-e-beam scanning system.

|  | Single Wafer System | AMS System |
|---|---|---|
| $n_{shift}$ | 624 | 103 |
| $FP_v$ (mm) | 1150 | 1150 |

TABLE 2-continued

Parameters of a multiple-e-beam scanning system.

| | Single Wafer System | AMS System |
|---|---|---|
| $FP_h$ (mm) | 650 | 650 |
| $t_{sc}$ (sec) | 0.095 | |
| $t_m$ (sec) | 0.025 | |
| $t_{sw}$ (sec) | 185.85 | |
| $n_w * FP_v$ (m) | 8.05 | 5.70 |
| $n_w * FP_h$ (m) | 0.65 | 0.65 |
| $n_w * FP$ (m$^2$) | 5.23 | 3.71 |
| $t_{nw}$ (sec) | | 174 |
| wph | 136 | 145 |
| Rel. wph | 1.00 | 1.07 |
| Rel. FP | 1.00 | 0.71 |
| wph/col | 3.23 | 4.02 |
| wph/m$^2$ | 25.91 | 39.08 |

FIG. 5D is a schematic drawing illustrating the "step and scan" exposure on a plurality of wafers using multiple exposure tools 500 of FIG. 5A and multiple wafer carriers 504 of FIG. 5B. The multiple wafer carriers 504 can be independent from each other, or integrated together as a common wafer carrier to save footprint in the x direction if necessary. In some embodiments, the plurality of wafers may be placed on each wafer carrier 504 along the scanning direction (e.g., the y direction), and the multiple wafer carriers 504 may be configured to be along the stepping direction (e.g., the x direction) which is perpendicular to the scanning direction.

The present disclosure provides a lithography system comprising a radiation source and an exposure tool including a plurality of exposure columns packed in a first direction. Each exposure column includes an exposure area configured to pass the radiation source. The system also includes a wafer carrier configured to secure and move one or more wafers along a second direction that is perpendicular to the first direction so that the one or more wafers are exposed by the exposure tool to form patterns along the second direction. The one or more wafers are covered with resist layer and aligned in the second direction on the wafer carrier. In some embodiments, the one or more wafers may be configured to be along the first direction on the wafer carrier.

In some embodiments, the wafer carrier secures one or more wafer stages configured to be along the second direction, and each of the wafer stages is configured to secure a wafer.

In some embodiments, the plurality of exposure columns are packed adjacent to each other along the first direction on the exposure tool.

In some embodiments, the plurality of exposure columns are packed along the second direction in more than one row, and two adjacent rows of the exposure columns are shifted along the first direction by a distance that is substantially similar to the radius of the exposure column. The two adjacent rows form a unit column assembly (UCA).

In some embodiments, a plurality of UCAs are packed along the second direction, and two adjacent UCAs are shifted along the first direction by a distance that is less than the radius of the exposure column.

In some embodiments, the wafer carrier is configured to move the one or more wafers relative to the exposure tool along the first direction by a distance that is less than a width of the exposure area in the first direction.

In some embodiments, the lithography system further comprises a wafer metrology system (WMS) configured to measure and collect position data of the wafer carrier, the exposure tool, or a combination thereof.

In some embodiments, the lithography system further comprises an alignment tool configured to adjust the one or more wafers so that the patterns to be exposed are aligned with previous patterns formed on the one or more wafers.

In some embodiments, the radiation source of the lithography system includes photons. The radiation source of the lithography system may include electrons. The radiation source of the lithography system may include ions.

In some embodiments, a number of the exposure columns included in the exposure tool, and a number of wafers included in the wafer carrier are optimized to increase throughput and to reduce footprint.

In yet some other embodiments, a method for patterning a plurality of wafers comprises providing an exposure tool including a plurality of exposure columns densely packed in a first direction, each exposure column including an exposure area; loading a plurality of wafers coated with resist layers to be configured along a second direction that is perpendicular to the first direction on a wafer carrier; emitting a radiation source through the exposure area of each exposure column to expose the plurality of coated wafers; moving the wafer carrier along the second direction so that the exposure tool exposes the plurality of coated wafers along the second direction to form resist patterns; and stepping the wafer carrier along the first direction by a distance that is less than a width of the exposure area in the first direction.

In some embodiments, moving the wafer carrier along the second direction includes accelerating the plurality of coated wafers on the wafer carrier along the second direction; exposing the plurality of coated wafers using the radiation source passing through the exposure area of each exposure column; and decelerating the plurality of exposed wafers. In some embodiments, exposing the plurality of coated wafers is performed at a constant speed.

In some embodiments, the plurality of exposure columns are packed adjacent to each other along the first direction on the exposure tool.

In some embodiments, the method further comprises performing alignment of the plurality of coated wafers using an alignment tool so that the resist patterns to be exposed are aligned with previous patterns formed on the one or more wafers.

In some embodiments, the method further comprises measuring position data of the wafer carrier, the exposure tool, or a combination thereof using a wafer metrology system (WMS).

In some embodiments, the plurality of exposure columns are further packed along the second direction in more than one row on the exposure tool, and two adjacent rows of the exposure columns are shifted along the first direction by a distance that is substantially similar to the radius of the exposure column. The two adjacent rows form a unit column assembly (UCA).

In some embodiments, a plurality of UCAs are packed along the second direction, and two adjacent UCAs are shifted along the first direction by a distance that is less than the radius of the exposure column.

In some embodiments, a number of the exposure columns included in the exposure tool, and a number of wafers included in the wafer carrier are optimized to increase throughput and to reduce footprint.

In some embodiments, the method further comprises loading the plurality of wafers to be configured along the first direction.

In some embodiments, the radiation source includes any ones selected from the group consisting of photons, electrons, and ions.

In yet some other embodiments, a method for forming resist patterns on a plurality of wafers comprises coating resist films on a plurality of wafers; loading the plurality of coated wafers on a wafer carrier along a first direction; exposing the resist films on the plurality of wafers using an exposure tool along the first direction; stepping the wafer carrier along the second direction by a distance less than a width of an exposure area included in each exposure column in the first direction; and developing the exposed resist film to form the resist patterns on the plurality of wafers. In some embodiments, the exposure tool includes a plurality of exposure columns densely packed in a second direction that is perpendicular to the first direction.

Some common forms of the computer readable media used in the present invention may include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography apparatus, comprising:
    a wafer carrier configured to hold one or more wafers and move the one or more wafers along a scanning direction;
    a radiation source configured to produce radiation;
    a unit column assembly (UCA) that includes a plurality of exposure columns each configured to pass the radiation through a respective exposure area of the exposure column;
        wherein the exposure columns are arranged in the UCA such that:
        a first plurality of the exposure columns are disposed adjacent to one another in a stepping direction; and
        a second plurality of the exposure columns are disposed adjacent to one another in the scanning direction, the scanning direction being different from the stepping direction; and
    a controller that is configured to perform a "step-and-scan" exposure process in which the one or more wafers are scanned in the scanning direction and stepped in the stepping direction, and wherein a stepping distance in the "step-and-scan" exposure process is less than a dimension of the exposure area in the stepping direction.

2. The lithography apparatus of claim 1, further comprising: metrology tools configured to measure positional information of the one or more wafers in both the stepping direction and the scanning direction.

3. The lithography apparatus of claim 1, wherein the UCA is configured to expose more than one wafer during a single exposure operation without performing a wafer exchange.

4. The lithography apparatus of claim 1, wherein the first plurality of the exposure columns are offset from one another in the stepping direction.

5. The lithography apparatus of claim 4, wherein an offset between the first plurality of the exposure columns is substantially equal to a radius of the exposure column.

6. The lithography apparatus of claim 5, further comprising: a plurality of unit column assemblies (UCAs) disposed along the scanning direction.

7. The lithography apparatus of claim 6, wherein an offset in the stepping direction exists between adjacent UCAs, the offset being less than a radius of the exposure column.

8. The lithography apparatus of claim 1, wherein the radiation source is configured to generate photons, electrons, or ions as the radiation.

9. A lithography system, comprising:
    a radiation source configured to produce radiation;
    a wafer carrier configured to hold and move one or more wafers;
    a controller configured to control the wafer carrier to move the one or more wafers along both a scanning direction and a stepping direction in a "step-and-scan" exposure process, the stepping direction different from the scanning direction; and
    a plurality of unit column assemblies (UCAs) disposed along the scanning direction, the UCAs each including at least a first row and a second row of exposure columns, the exposure columns each being configured to pass the radiation through a respective exposure area of the exposure column, wherein the first and second rows each extend in the stepping direction and are disposed relative to one another in the scanning direction, and wherein adjacent UCAs are offset in the stepping direction by a distance that is less than a radius of the exposure column.

10. The lithography system of claim 9, wherein a stepping distance in the "step-and-scan" exposure process is less than a dimension of the exposure area in the stepping direction.

11. The lithography system of claim 9, further comprising: wafer metrology equipment configured to acquire positional data of the wafer carrier, or positional data of the UCA, or combinations thereof.

12. The lithography system of claim 9, wherein a dimension of the UCA in the stepping direction exceeds a diameter of each of the one or more wafers.

13. The lithography system of claim 9, wherein the first row is offset from the second row in the stepping direction by a distance that is substantially equal to a radius of the exposure column.

14. A method of performing lithography, comprising:
    providing a radiation source;
    providing an exposure tool that includes one or more unit column assemblies (UCAs), each UCA including at least a first row and a second row of exposure columns, wherein the first and second rows each extend in a first direction and include a respective plurality of the exposure columns, and wherein the first and second rows are disposed relative to one another in a second direction different from the first direction; and exposing, by passing the radiation source through an exposure area of each exposure column, one or more wafers in a "step-and-scan" process in which the one or more wafers are scanned along the second direction and stepped along the first direction, and wherein the exposing comprises configuring a stepping distance in the "step-and-scan" exposure process to be less than a dimension of the exposure area in the first direction.

15. The method of claim 14, wherein the providing of the exposure tool is performed such that a dimension of each UCA in the first direction exceeds a diameter of each of the one or more wafers.

16. The method of claim 14, wherein the providing of the exposure tool is performed such that the first row is offset from the second row in the first direction by a distance that is substantially equal to a radius of the exposure column.

17. The lithography apparatus of claim 1, wherein a dimension of the UCA in the stepping direction exceeds a diameter of each of the one or more wafers.

18. The method of claim 14, wherein the providing of the radiation source comprises generating photons, electrons, or ions as radiation.

19. The method of claim 14, further comprising using metrology tools to measure positional information of the one or more wafers in both the first direction and the second direction.

20. The method of claim 14, wherein the one or more UCAs comprise a plurality of UCAs that are disposed along the second direction.

* * * * *